United States Patent
Khoo et al.

(10) Patent No.: US 9,595,312 B1
(45) Date of Patent: Mar. 14, 2017

(54) ADAPTIVE REFRESH SCHEDULING FOR MEMORY

(71) Applicant: ALTERA CORPORATION, San Jose, CA (US)

(72) Inventors: Kay Keat Khoo, Bayan Lepas (MY); Weng Li Leow, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/086,884

(22) Filed: Mar. 31, 2016

(51) Int. Cl.
| G11C 7/00 | (2006.01) |
| G11C 11/406 | (2006.01) |
| G11C 29/50 | (2006.01) |

(52) U.S. Cl.
CPC ............ G11C 11/406 (2013.01); G11C 29/50 (2013.01); *G11C 2029/5006* (2013.01)

(58) Field of Classification Search
CPC ..................................................... G11C 7/00
USPC ....................................... 365/189.011–225.7
See application file for complete search history.

(56) References Cited

U.S. PATENT DOCUMENTS

| 4,910,706 | A | * | 3/1990 | Hyatt | .................. B60R 16/0373 365/189.011 |
| 5,146,589 | A | | 9/1992 | Peet, Jr. et al. | |
| 7,167,403 | B2 | * | 1/2007 | Riho | ................... G06F 11/1004 365/200 |
| 7,260,011 | B2 | * | 8/2007 | Riho | ................... G06F 11/1004 365/189.07 |
| 7,355,919 | B2 | * | 4/2008 | Riho | ................... G06F 11/1004 365/205 |
| 7,603,512 | B2 | | 10/2009 | Seo | |
| 9,141,561 | B2 | | 9/2015 | Lasserre et al. | |
| 2005/0169083 | A1 | * | 8/2005 | Riho | ................... G06F 11/1004 365/222 |
| 2007/0097772 | A1 | * | 5/2007 | Riho | ................... G06F 11/1004 365/222 |
| 2007/0230265 | A1 | * | 10/2007 | Riho | ................... G06F 11/1004 365/222 |
| 2014/0082272 | A1 | | 3/2014 | Brittain et al. | |
| 2014/0122790 | A1 | | 5/2014 | Lasserre et al. | |
| 2015/0318035 | A1 | | 11/2015 | Dong et al. | |

* cited by examiner

*Primary Examiner* — Harry W Byrne
(74) *Attorney, Agent, or Firm* — Okamoto & Benedicto LLP

(57) ABSTRACT

The present disclosure provides for adaptive scheduling of memory refreshes. One embodiment relates to a method of adapting an initial refresh sequence. In this method, flow and blockage scores for each refresh sequence of a plurality of refresh sequences are obtained and stored in an array of scores. An initial refresh sequence is selected in a way that favors a high flow score and a low blockage score. Another embodiment relates to a method of adapting a current refresh sequence. Current flow and blockage scores are obtained and stored for the current refresh sequence. The current flow and blockage scores are used to update (by averaging, for example) the existing flow and blockage scores for the current refresh sequence. The next refresh sequence is then chosen from amongst a plurality of refresh sequences in a way that favors a high flow score and a low blockage score.

20 Claims, 7 Drawing Sheets

| Flow Score Registers | Blockage Score Registers | Selected Sequence Register |
|---|---|---|
| seq1_fscore_reg | seq1_bscore_reg | selected_seqs_reg |
| seq2_fscore_reg | seq2_bscore_reg | |
| seq3_fscore_reg | seq3_bscore_reg | Score Registers for Selected Sequence |
| seq4_fscore_reg | seq4_bscore_reg | seqs_fscore_reg |
| seq5_fscore_reg | seq5_bscore_reg | seqs_bscore_reg |
| . | . | |
| . | . | |
| seq22_fscore_reg | seq22_bscore_reg | |
| seq23_fscore_reg | seq23_bscore_reg | |
| seq24_fscore_reg | seq24_bscore_reg | |

FIG. 4

| Traffic Pattern | Fixed Refresh Scheme | Adaptive Refresh Scheme (initial) | Adaptive Refresh Scheme (optimal) |
|---|---|---|---|
| 0% Random, 100% Sequential | 7.24 GB/s | 7.73 GB/s (+6.78%) | 7.81 GB/s (+7.91%) |
| 25% Random, 75% Sequential | 6.99 GB/s | 7.46 GB/s (+6.73%) | 7.70 GB/s (+10.11%) |
| 50% Random, 50% Sequential | 7.10 GB/s | 7.54 GB/s (+6.10%) | 7.61 GB/s (+7.08%) |
| 65% Random, 35% Sequential | 7.94 GB/s | 8.43 GB/s (+6.19%) | 8.72 GB/s (+9.81%) |
| 66% Random, 34% Sequential | 7.89 GB/s | 8.38 GB/s (+6.22%) | 8.67 GB/s (+9.86%) |
| 75% Random, 25% Sequential | 6.94 GB/s | 7.32 GB/s (+5.52%) | 7.47 GB/s (+7.63%) |
| 100% Random, 0% Sequential | 6.72 GB/s | 7.05 GB/s (+4.91%) | 7.21 GB/s (+7.25%) |

ADAPTIVE REFRESH SCHEDULING FOR MEMORY

BACKGROUND

Technical Field

The present disclosure relates to memory controllers and memory refresh techniques.

Description of the Background Art

Dynamic random access memory (DRAM) generally requires periodic refreshes to preserve the data stored therein. However, as DRAMs have increased in memory size and performance, the overhead due to refresh operations have become a substantial drag on performance.

SUMMARY

The present disclosure provides for adaptive scheduling of memory refreshes.

One embodiment relates to a method of adapting an initial refresh sequence. In this method, flow and blockage scores for each refresh sequence of a plurality of refresh sequences are obtained and stored in an array of scores. An initial refresh sequence is selected in a way that favors a high flow score and a low blockage score. This method may be considered as performing a pre-check of flow and blockage to select a refresh sequence that is likely to avoid user traffic.

Another embodiment relates to a method of adapting a current refresh sequence. Current flow and blockage scores are obtained and stored for the current refresh sequence. The current flow and blockage scores are used to update (by averaging, for example) the existing flow and blockage scores for the current refresh sequence. The next refresh sequence is then chosen from amongst a plurality of refresh sequences in a way that favors a high flow score and a low blockage score. This method may be considered as performing a hindsight-based check of flow and blockage to select a next refresh sequence in an attempt to avoid future "collisions" between memory commands and refresh quarantines.

Other embodiments relate to memory controllers that implement the methods disclosed herein.

BRIEF DESCRIPTION OF THE DRAWINGS

FIG. 4 depicts registers of a memory controller in accordance with an embodiment of the invention.

FIG. 5 is a table showing performance improvement achieved by an exemplary implementation of the presently-disclosed adaptive refresh scheduling technique.

DETAILED DESCRIPTION

The present disclosure relates to an adaptive technique for scheduling refreshes of DRAM. The adaptive refresh scheduling technique advantageously enables DRAM memory controllers to improve latency and bandwidth.

Figure 1:
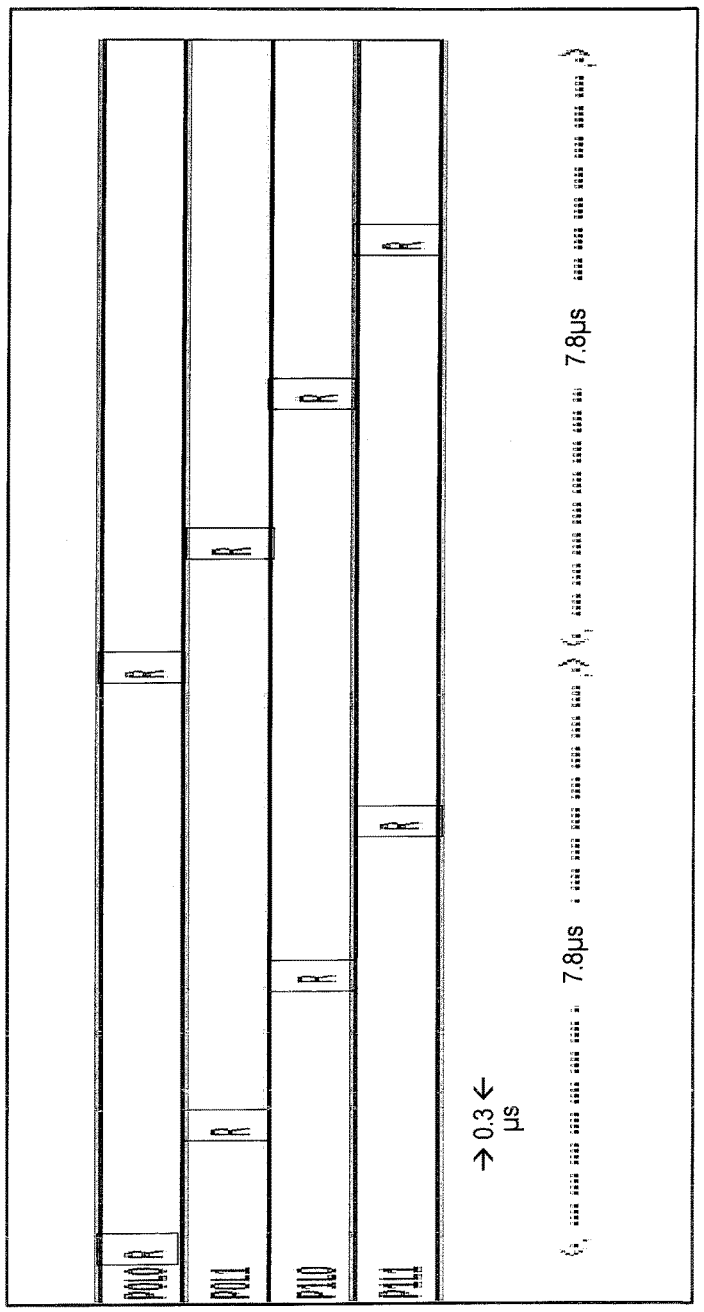
FIG. 1 depicts a DRAM refresh scheduling scheme that uses a fixed interval and a fixed sequence.

An example of a conventional refresh scheduling scheme is shown in FIG. 1. In particular, FIG. 1 depicts a DRAM refresh scheduling scheme that uses a fixed interval and a fixed sequence.

For reasons of simplicity, the depicted example is for a memory with four ranks: P0L0; P0L1; P1L0; and P1L1. The rank PN refers to physical rank N, and LM refers to logical rank M. Hence, P0L0 refers to physical rank 0 and logical rank 0, P0L1 refers to physical rank 0 and logical rank 1, P1L0 refers to physical rank 1 and logical rank 0, and P1L1 refers to physical rank 1 and logical rank 1.

As depicted, the refresh scheduling repeats cycles of the sequence: P0L0; P0L1; P1 L0; and P1L1. In the illustrated example, each cycle has a time period of 7.8 microseconds, and each refresh of a rank is performed over a 0.3 microsecond interval.

The conventional refresh scheduling scheme of FIG. 1 is straightforward to implement. However, once launched, the conventional protocol mandates that the refreshed rank is quarantined during a quarantine window, typically for hundreds of nanoseconds, while that rank is being refreshed.

The quarantine effectively blocks out reads and writes to the same rank. This increases the latency for traffic which targets a quarantined rank. Moreover, while bandwidth may be reclaimed by directing traffic to non-quarantined ranks, bandwidth is lost (not reclaimed) if there is no traffic scheduled for non-quarantined ranks. For example, bandwidth is lost when all queued commands happen to target the quarantined rank, or when strict ordering requirements prohibit out-of-order command execution. In a worst case, memory access patterns are scheduled in a manner that repeatedly collides with refresh patterns.

Moreover, the quarantine of the refreshed rank is potentially problematic for high-priority read accesses which are time-sensitive (for example, reads from display buffers or audio buffers). In order to compensate for this potential problem, very large prefetch buffers may need to be implemented.

Other refresh schemes, besides one such as shown in FIG. 1, may also be used. For example, an opportunistic refresh scheme may defer or postpone refreshing until an opportunity arises due to idling or until the specification limit between refreshes is reached. This allows for a longer contiguous window for memory accesses (unhindered by refreshes), but the latency penalty may become even larger if there is insufficient idle to opportunistically perform refreshes. In another example, finer-grain refreshes may be used. This shortens the per-refresh quarantine time (tRFC), but it also increases the number of refreshes required.

The present disclosure provides an innovative technique for scheduling memory refreshes. The technique may utilize both a pre-check before selecting an initial refresh sequence and a hindsight check to adapt the refresh sequence.

Exemplary Method

Figure 2:
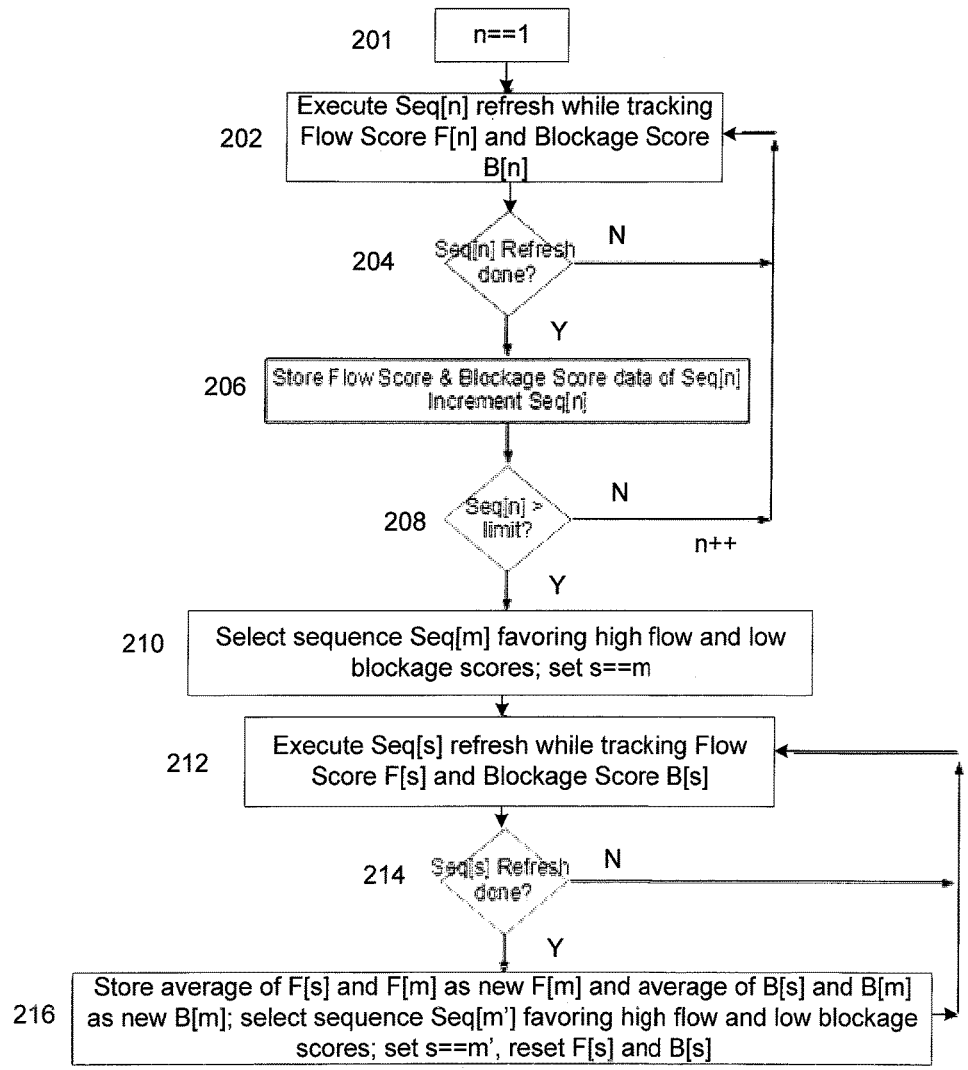
FIG. 2 is a flow chart of a method of adaptive refresh scheduling for memory in accordance with an embodiment of the invention.

FIG. 2 is a flow chart of a method 200 of adaptive refresh scheduling for memory in accordance with an embodiment of the invention. The method 200 includes an initial phase during which an initial refresh sequence is applied; and a subsequent phase during which the refresh sequence is adaptively selected.

The initial phase includes steps 201 through 210. This initial phase executes a flexible procedure which implements a pre-check of flow and blockage to select a refresh sequence that is likely to avoid user traffic.

In step 201, a variable n may be set to 1 (n==1). This variable n identifies a refresh sequence among a number of possible sequences.

Consider a first (simple) example where there are two physical ranks 0 and 1 and two logical ranks 0 and 1. A list of 4!=24 possible refresh sequences Seq[n], n=1 to 24, is shown below in Table 1. Each of the possible refresh sequences ensures that all ranks are refreshed because each sequence covers all physical/logical ranks.

TABLE 1

| n | Seq[n] |
|---|--------|
| 1 | P0L0, P0L1, P1L0, P1L1 |
| 2 | P0L0, P1L0, P0L1, P1L1 |
| 3 | P0L0, P0L1, P1L1, P1L0 |
| 4 | P0L0, P1L0, P1L1, P0L1 |
| 5 | P0L0, P1L1, P1L0, P0L1 |
| 6 | P0L0, P1L1, P0L1, P1L0 |
| 7 | P0L1, P0L0, P1L0, P1L1 |
| 8 | P1L0, P0L0, P0L1, P1L1 |
| 9 | P0L1, P0L0, P1L1, P1L0 |
| 10 | P1L0, P0L0, P1L1, P0L1 |
| 11 | P1L1, P0L0, P1L0, P0L1 |
| 12 | P1L1, P0L0, P0L1, P1L0 |
| 13 | P0L1, P1L0, P0L0, P1L1 |
| 14 | P1L0, P0L1, P0L0, P1L1 |
| 15 | P0L1, P1L1, P0L0, P1L0 |
| 16 | P1L0, P1L1, P0L0, P0L1 |
| 17 | P1L1, P1L0, P0L0, P0L1 |
| 18 | P1L1, P0L1, P0L0, P1L0 |
| 19 | P0L1, P1L0, P1L1, P0L0 |
| 20 | P1L0, P0L1, P1L1, P0L0 |
| 21 | P0L1, P1L1, P1L0, P0L0 |
| 22 | P1L0, P1L1, P0L1, P0L0 |
| 23 | P1L1, P1L0, P0L1, P0L0 |
| 24 | P1L1, P0L1, P1L0, P0L0 |

Note that the 24 enumerated refresh sequences do not have to be in the specific order shown. Other orderings (i.e. other mappings between the variable n and the sequences) may be used.

Consider a second example where there are two physical ranks 0 and 1 and four logical ranks 0, 1, 2 and 3. In this case there are 8!=40,320 possible refresh sequences Seq[n], n=1 to 40,320, as illustrated below in Table 2. Each of the possible refresh sequences ensures that all ranks are refreshed because each sequence covers all physical/logical ranks.

TABLE 2

| n | Seq[n] |
|---|--------|
| 1 | P0L0, P0L1, P0L2, P0L3, P1L0, P1L1, P1L2, P1L3 |
| 2 | P0L0, P0L2, P0L1, P0L3, P1L0, P1L1, P1L2, P1L3 |
| ... | ... |
| 40,320 | P1L3, P1L2, P1L1, P1L0, P0L3, P0L2, P0L1, P0L0 |

Figure 3:
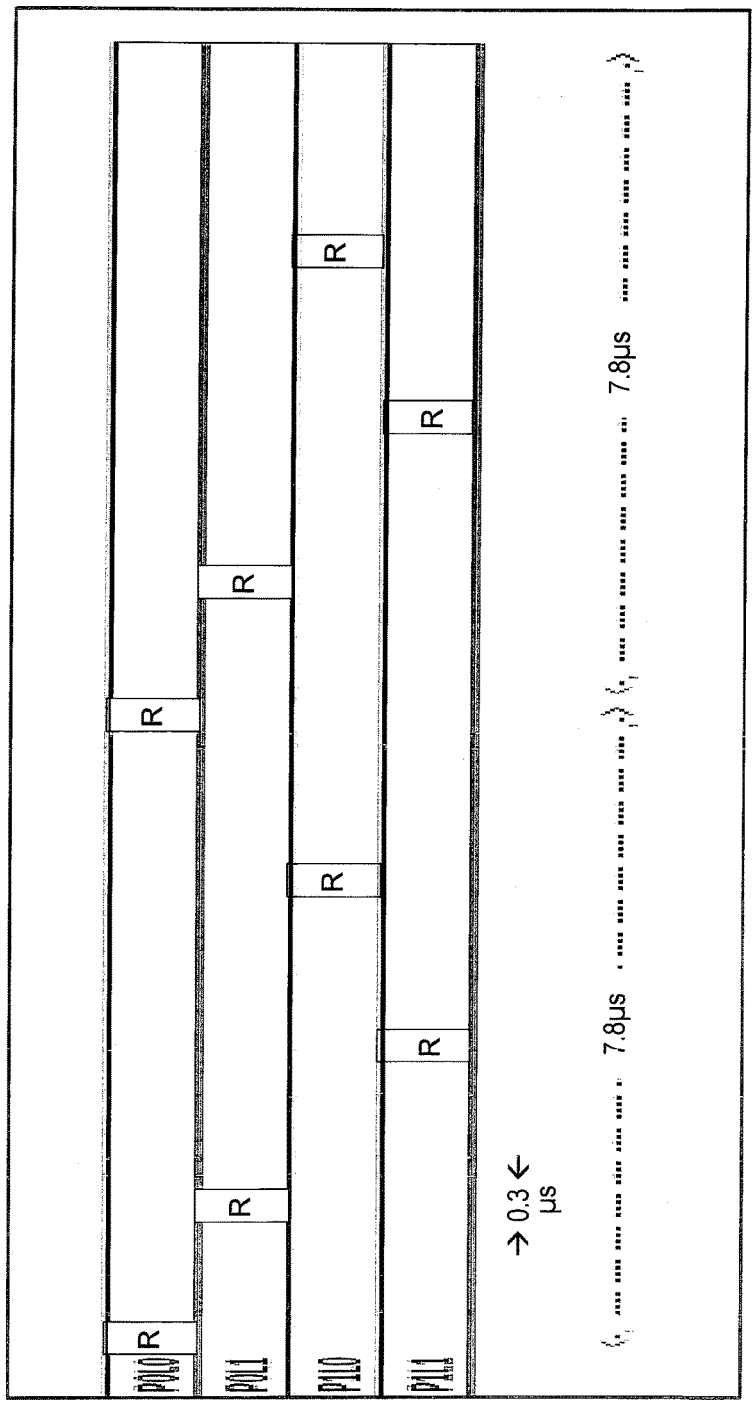
FIG. 3 illustrates the execution of an example refresh sequence in accordance with an embodiment of the invention.

In step 202, the refresh sequence Seq[n] is executed. For instance, FIG. 3 illustrates the execution of Seq[3] in Table 1. As depicted, the refresh scheduling repeats cycles of the sequence: P0L0; P0L1; P1L1; and P1L0. In the illustrated example, each cycle has a time period of 7.8 microseconds, and each refresh of a rank is performed over a 0.3 microsecond interval.

During the execution of Seq[n], a flow score F[n] and a blockage score B[n] for that sequence are tracked. The flow score F[n] counts, within the quarantine windows, the number of commands executed. The commands may include memory read commands and memory write commands. The blockage score B[n] counts, within the quarantine windows, the number of commands blocked due to the quarantine. The blocked commands are generally the commands that target the rank in refresh.

Hence, if a command is executed within the quarantine windows (due to its targeting a rank not in refresh), then that command is counted in the flow score F[n]. On the other hand, if a command is blocked (so as to remain in the command queue) within the quarantine window, then that command is counted in the blockage score B[n].

Per step 204, the execution of the refresh sequence Seq[n] continues (by looping back to step 202) until the execution of that sequence is finished. In one implementation, the execution of the refresh sequence may be finished after a predetermined time interval has elapsed. The predetermined time interval may be on the order of 100 nanoseconds, for example. Once the execution of that sequence is finished, then the method 200 moves forward to step 206.

In step 206, the flow score F[n] and the blockage score B[n] are stored for the sequence n. In one implementation, the memory controller may include a pair of registers to store the flow score F[n] and the blockage score B[n] for each sequence n. In such an implementation, if the number of sequences is 24 (as in the first example illustrated by Table 1), then there would be 24 pairs of registers to store these scores. On the other hand, if the number of sequences is 40,320 (as in the second example illustrated by Table 2), then there would be 40,320 pairs of registers to store these scores. In addition, the variable n is incremented (n++) so as to go to the next sequence Seq[n].

Per step 208, unless the variable n has reached the maximum limit (for example, n=24 in the first example illustrated by Table 1, or n=40,320 in the second example illustrated by Table 2), the method 200 then loops back to step 202. Steps 202 through 208 is thus performed for each sequence Seq[n]. Once the variable n reaches the maximum limit, then the method 200 moves forward to step 210.

In step 210, selection is made of the sequence Seq[m] in a way that favors a high flow score and a low blockage score. In an exemplary implementation, the selected sequence Seq[m] is the sequence with the lowest ratio of blockage score to flow score. In other words, the ratio B[n]/F[n] may be computed for each n (from 1 to the maximum limit), and Seq[m] is the sequence corresponding to the minimum ratio B[m]/F[m]. This refresh sequence is selected to be the initial "current" refresh sequence by setting s to m (s==m).

With this selection, the initial phase is completed and the method 200 moves forward to step 212. Steps 212 to 216 may be considered as implementing a hindsight-based check of flow and blockage to select a next refresh sequence in an attempt to avoid future "collisions" between memory commands and refresh quarantines.

In step 212, the current refresh sequence Seq[s] is executed. During the execution of the current refresh sequence Seq[s], a current flow score F[s] and a current blockage score B[s] for that sequence is tracked. The current flow score F[s] counts, within the quarantine windows, the number of commands executed (despite the quarantine). The current blockage score B[s] counts, within the quarantine windows, the number of commands blocked (due to the quarantine).

Per step 214, the execution of the current refresh sequence Seq[s] continues (by looping back to step 212) until the execution of that sequence is finished. In one implementation, the execution may be finished when the sequence has been executed for a predetermined time period, such as 1 millisecond, for example. Once the execution of the current refresh sequence is finished, then the method 200 moves forward to step 216.

In step 216, the existing flow score F[m] and the existing blockage score B[m] for Seq[m] as stored in an array of scores may be updated by averaging them with current flow score F[s] and the current blockage score B[s], respectively. In other words, F[m]==average(F[m],F[s]), and B[m]==average(B[m],B[s]).

A next Seq[m] may then be selected using the array of scores (after the update) in a way that favors a high flow score and a low blockage score. In one implementation, the ratio B[n]/F[n] may be computed for each n (from 1 to the maximum limit), and the next Seq[m'] is the sequence corresponding to the minimum ratio B[m']/F[m]. Selection is made of this refresh sequence by setting s to m' (s==m'), and the flow and blockage scores are reset (F[s]==0 and B[s]==0). The method 200 then loops back to step 212.

FIG. 4 depicts registers of a memory controller in accordance with an embodiment of the invention. These registers may be used to store and access data utilized by the method 200 described above in relation to FIG. 2.

As depicted in FIG. 4, the flow scores F[n] and blockage scores B[n] may be stored in register arrays. In accordance with the first example illustrated by Table 1, if the range of n is 1 to 24 (i.e. if $n_{max}$=24), then F[1] to F[24] may be stored in a first register array including seq1_fscore_reg to seq24_bscore_reg, and B[1] to B[24] may be stored in a second register array including seq1_bscore_reg to seq24_bscore_reg. In accordance with the second example illustrated by Table 2, the first and second register arrays would have 40,320 registers each.

As further depicted, the selected sequence Seq[s] may be stored in the register selected_seqs_register. The flow score for the selected sequence may be stored in the register seqs_fscore_reg, and the blockage score for the selected sequence may be stored in the register seqs_bscore_reg.

Performance Improvements

FIG. 5 is a table showing performance improvement achieved by an exemplary implementation of the presently-disclosed adaptive refresh scheduling technique. The implementation is for DRAM with two physical ranks and four logical ranks, as in the second example illustrated by Table 2. The improvement is shown versus a fixed refresh scheme. As shown, the traffic pattern used to measure the performance is varied from 100% sequential to 100% random.

The first row shows results when the traffic pattern is 100% sequential. Such a sequential traffic pattern reads/writes data from/to sequential locations in memory. As shown, the fixed refresh scheme resulted in bandwidth of 7.24 gigabytes per second (GB/s). A higher bandwidth of 7.73 GB/s is achieved using the initially-selected refresh sequence from the adaptive refresh method disclosed herein. The initially-selected refresh sequence corresponds to the sequence selected in step 210 of FIG. 2. An even higher bandwidth of 7.81 GB/s is achieved using the "optimal" refresh sequence from the adaptive refresh method disclosed herein. The optimal refresh sequence corresponds to the sequence selected in step 216 of FIG. 2 after sufficient iterations of the loop including steps 212 to 216 so as to arrive at the optimal refresh sequence.

The second row shows results when the traffic pattern is 25% random and 75% sequential. While the sequential traffic pattern reads/writes data from/to sequential locations in memory, the random traffic pattern reads/writes data to random locations in memory. As shown, the fixed refresh scheme resulted in bandwidth of 6.99 GB/s. A higher bandwidth of 7.46 GB/s is achieved using the initially-selected refresh sequence from the adaptive refresh method disclosed herein. An even higher bandwidth of 7.70 GB/s is achieved using the "optimal" refresh sequence from the adaptive refresh method disclosed herein.

The third row shows results when the traffic pattern is 50% random and 50% sequential. As shown, the fixed refresh scheme resulted in bandwidth of 7.10 GB/s. A higher bandwidth of 7.54 GB/s is achieved using the initially-selected refresh sequence from the adaptive refresh method disclosed herein. An even higher bandwidth of 7.61 GB/s is achieved using the "optimal" refresh sequence from the adaptive refresh method disclosed herein.

The fourth row shows results when the traffic pattern is 65% random and 35% sequential. As shown, the fixed refresh scheme resulted in bandwidth of 7.94 GB/s. A higher bandwidth of 8.43 GB/s is achieved using the initially-selected refresh sequence from the adaptive refresh method disclosed herein. An even higher bandwidth of 8.72 GB/s is achieved using the "optimal" refresh sequence from the adaptive refresh method disclosed herein.

The fifth row shows results when the traffic pattern is 66% random and 34% sequential. As shown, the fixed refresh scheme resulted in bandwidth of 7.89 GB/s. A higher bandwidth of 8.38 GB/s is achieved using the initially-selected refresh sequence from the adaptive refresh method disclosed herein. An even higher bandwidth of 8.67 GB/s is achieved using the "optimal" refresh sequence from the adaptive refresh method disclosed herein.

The sixth row shows results when the traffic pattern is 75% random and 25% sequential. As shown, the fixed refresh scheme resulted in bandwidth of 6.94 GB/s. A higher bandwidth of 7.32 GB/s is achieved using the initially-selected refresh sequence from the adaptive refresh method disclosed herein. An even higher bandwidth of 7.47 GB/s is achieved using the "optimal" refresh sequence from the adaptive refresh method disclosed herein.

The seventh row shows results when the traffic pattern is 100% random. As shown, the fixed refresh scheme resulted in bandwidth of 6.72 GB/s. A higher bandwidth of 7.05 GB/s is achieved using the initially-selected refresh sequence from the adaptive refresh method disclosed herein. An even higher bandwidth of 7.21 GB/s is achieved using the "optimal" refresh sequence from the adaptive refresh method disclosed herein.

Implementations on FPGA and in Electronic System

Figure 6:
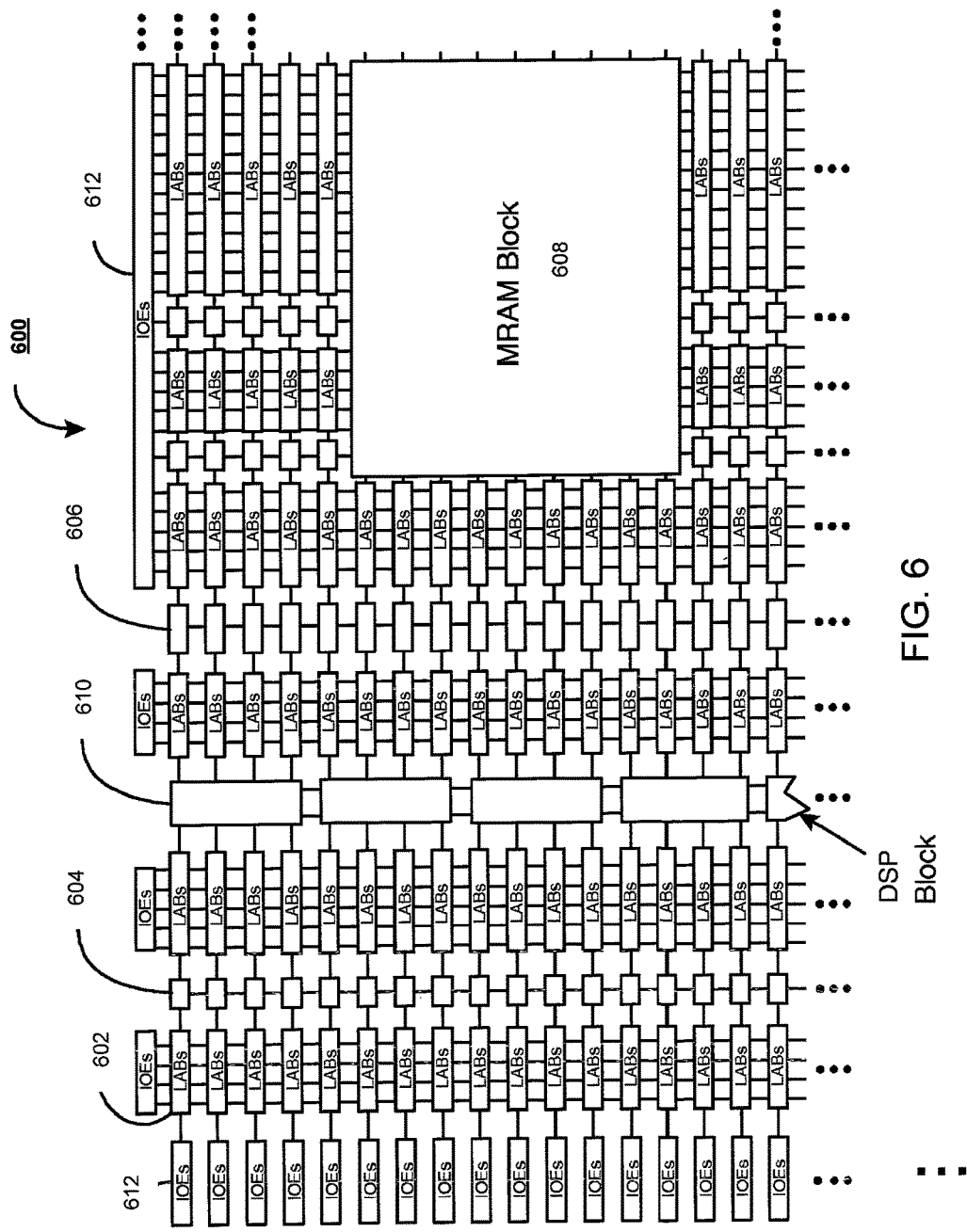
FIG. 6 is a simplified partial block diagram of a field programmable gate array (FPGA) that may be configured with circuitry to implement an embodiment of the present invention.

FIG. 6 is a simplified partial block diagram of a field programmable gate array (FPGA) 600 that may be configured with circuitry to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 600 includes within its "core" a two-dimensional array of programmable logic array blocks (or LABs) 602 that are interconnected by a network of column and row interconnect conductors of varying length and speed. LABs 602 include multiple logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 may also include a distributed memory structure including random access memory (RAM) blocks of varying sizes provided throughout the array. The RAM blocks include, for example, blocks 604, blocks 606, and block 608. These memory blocks can also include shift registers and FIFO buffers.

FPGA 600 may further include digital signal processing (DSP) blocks 610 that can implement, for example, multipliers with add or subtract features Input/output elements (IOEs) 612 located, in this example, around the periphery of the chip support numerous single-ended and differential input/output standards. Each IOE 612 is coupled to an external terminal (i.e., a pin) of FPGA 600.

It is to be understood that FPGA 600 is described herein for illustrative purposes only and that the present invention can be implemented in many different types of PLDs, FPGAs, and ASICs.

In one implementation, the presently-disclosed adaptive memory refresh scheduling method may be used to control the RAM blocks in an FPGA, such as depicted in FIG. 6. The method may be implemented using memory control logic and registers implemented in the FPGA.

Figure 7:
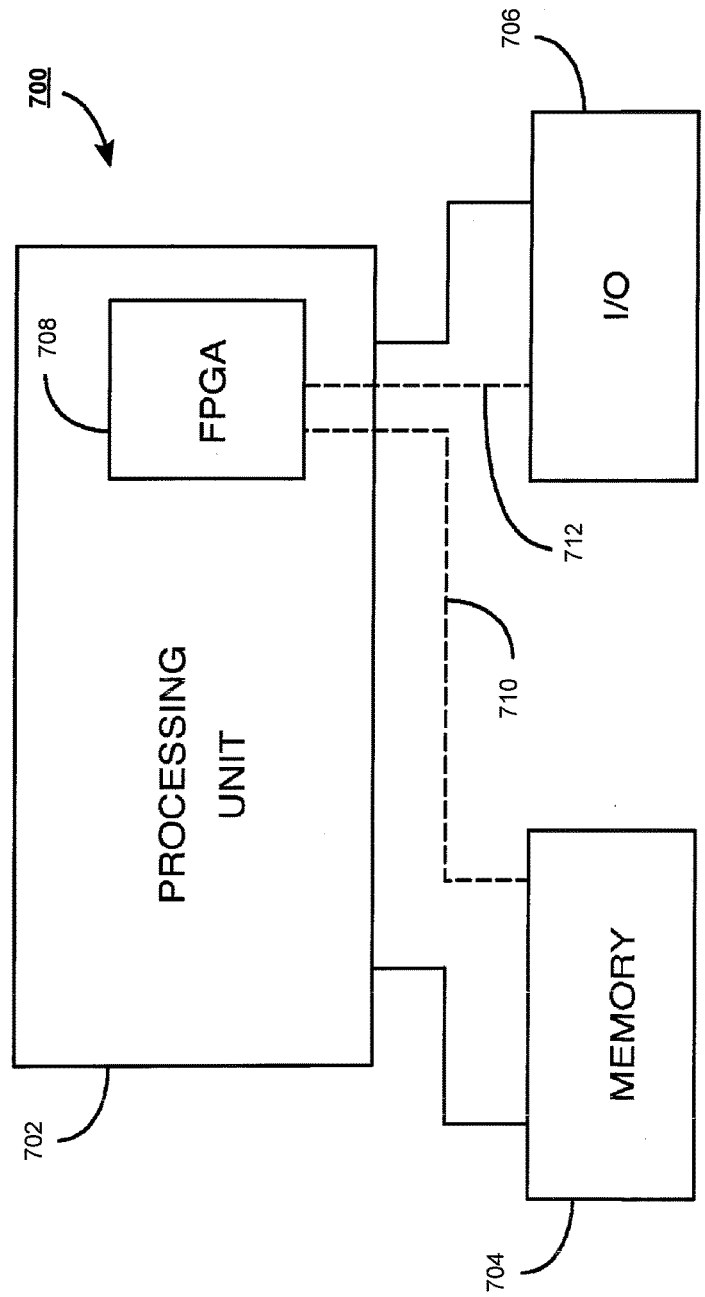
FIG. 7 is a block diagram of an exemplary system within which the presently-disclosed techniques may be implemented in accordance with an embodiment of the invention.

FIG. 7 is a block diagram of an exemplary system 700 within which the presently-disclosed techniques may be implemented in accordance with an embodiment of the invention. System 700 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704, and an input/output (I/O) unit 706 interconnected together by one or more buses. According to this exemplary embodiment, FPGA 708 may be embedded in processing unit 702. FPGA 708 can serve many different purposes within the system 700.

FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 may direct data to an appropriate system component for processing or storage, execute a program stored in memory 704, receive and transmit data via I/O unit 706, or other similar function. Processing unit 702 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 may control the logical operations of the system. As another example, FPGA 708 acts as a reconfigurable processor that may be reprogrammed as needed to handle a particular computing task. Alternately, FPGA 708 may itself include an embedded microprocessor. Memory unit 704 may be a random access memory (RAM), read only memory (ROM), fixed or flexible disk media, flash memory, tape, or any other storage means, or any combination of these storage means.

In one implementation, the presently-disclosed adaptive memory refresh scheduling method may be used to control RAM in a system, such as the system depicted in FIG. 7. The method may be implemented using memory control logic and registers implemented using in a processing unit and/or the FPGA, for example.

Conclusion

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method for adaptively refreshing memory, the method comprising:
    executing, in series, a plurality of refresh sequences for the memory;
    tracking a flow score for each refresh sequence in the plurality of refresh sequences;
    tracking a blockage score for each refresh sequence in the plurality of refresh sequences; and
    making an initial determination of a selected refresh sequence in a way that favors high flow and low blockage scores.

2. The method of claim 1, wherein each refresh sequence of the plurality of refresh sequences covers all physical/logical ranks of the memory so as to ensure that all ranks are refreshed.

3. The method of claim 1, wherein the memory has two physical ranks and four logical ranks.

4. The method of claim 1, wherein each refresh sequence in the plurality of refresh sequences is executed for a predetermined time interval.

5. The method of claim 1, wherein the flow score counts a number of commands executed within quarantine windows during the execution of the refresh sequence.

6. The method of claim 5, wherein the blockage score counts a number of commands blocked due to quarantine during the execution of the refresh sequence.

7. The method of claim 1, wherein the refresh sequence with a minimum ratio of blockage score to flow score is determined to be the selected refresh sequence.

8. The method of claim 1, further comprising:
    storing the flow and blockage scores for the plurality of refresh sequences in an array of registers.

9. The method of claim 8, further comprising:
    executing the selected refresh sequence for the memory;
    tracking a current flow score for the selected refresh sequence;
    tracking a current blockage score for the selected refresh sequence; and adapting the selected refresh sequence using the current flow score and the current blockage score.

10. The method of claim 9, wherein adapting the selected refresh sequence comprises:
   averaging the current flow score with the flow score for the selected refresh sequence in the array of registers to obtain a new flow score; and
   averaging the current blockage score with the blockage score for the selected refresh sequence in the array of registers to obtain a new blockage score.

11. The method of claim 10, wherein adapting the selected refresh sequence further comprises:
   replacing the flow score for the selected refresh sequence in the array of registers with the new flow score; and
   replacing the blockage score for the selected refresh sequence in the array of registers with the new blockage score.

12. The method of claim 11, wherein adapting the selected refresh sequence further comprises:
   choosing a next refresh sequence in a way that favors high flow and low blockage scores.

13. A method for adaptively refreshing memory, the method comprising:
   storing flow and blockage scores for a plurality of refresh sequences in an array of registers;
   executing a selected refresh sequence for the memory;
   tracking a current flow score for the selected refresh sequence;
   tracking a current blockage score for the selected refresh sequence; and
   adapting the selected refresh sequence using the current flow and blockage scores and the flow and blockage scores in the array of registers.

14. The method of claim 13, wherein adapting the selected refresh sequence comprises:
   averaging the current flow score with a flow score for the selected refresh sequence in the array of registers to obtain a new flow score; and
   averaging the current blockage score with a blockage score for the selected refresh sequence in the array of registers to obtain a new blockage score.

15. The method of claim 14, wherein adapting the selected refresh sequence further comprises:
   replacing the flow score for the selected refresh sequence in the array of registers with the new flow score; and
   replacing the blockage score for the selected refresh sequence in the array of registers with the new blockage score.

16. The method of claim 15, wherein adapting the selected refresh sequence further comprises:
   choosing a next refresh sequence from amongst the plurality of refresh sequences in a way that favors high flow and low blockage scores.

17. A memory controller comprising:
   a first register to store data indicating the selected refresh sequence;
   a second register to store a current flow score;
   a third register to store a current blockage score; and
   logic to performs steps including:
      executing the selected refresh sequence;
      tracking the current flow score for the selected refresh sequence;
      tracking the current blockage score for the selected refresh sequence; and
      adapting the selected refresh sequence using the current flow score and the current blockage score.

18. The memory controller of claim 17, further comprising:
   an array of registers storing flow and blockage scores for each refresh sequence of a plurality of refresh sequences,
   wherein the logic performs further steps including:
      averaging the current flow score with the flow score for the selected refresh sequence in the array of registers to obtain a new flow score;
      averaging the current blockage score with the blockage score for the selected refresh sequence in the array of registers to obtain a new blockage score;
      replacing the flow score for the selected refresh sequence in the array of registers with the new flow score;
      replacing the blockage score for the selected refresh sequence in the array of registers with the new blockage score; and
      choosing a next refresh sequence from amongst the plurality of refresh sequences in a way that favors high flow and low blockage scores.

19. The memory controller of claim 18, wherein the logic performs an initial phase comprising:
   executing, in series, the plurality of refresh sequences for the memory;
   tracking an initial flow score for each refresh sequence in the plurality of refresh sequences;
   tracking an initial blockage score for each refresh sequence in the plurality of refresh sequences; and
   making an initial determination of the selected refresh sequence in a way that favors high flow and low blockage scores.

20. The memory controller of claim 19, wherein the flow score counts a number of commands executed within quarantine windows during the execution of the refresh sequence, and wherein the blockage score counts a number of commands blocked due to quarantine during the execution of the refresh sequence.

* * * * *